(12) United States Patent
Aitken et al.

(10) Patent No.: US 6,999,354 B2
(45) Date of Patent: Feb. 14, 2006

(54) DYNAMICALLY ADAPTABLE MEMORY

(75) Inventors: Robert C. Aitken, San Jose, CA (US); Dhrumil Gandhi, Cupertino, CA (US)

(73) Assignee: ARM Physical IP, Inc., Sunnyvale, CA (US)

( * ) Notice: Subject to any disclaimer, the term of this patent is extended or adjusted under 35 U.S.C. 154(b) by 0 days.

(21) Appl. No.: 10/833,388

(22) Filed: Apr. 27, 2004

(65) Prior Publication Data

US 2005/0237823 A1 Oct. 27, 2005

(51) Int. Cl.
*G11C 11/34* (2006.01)
(52) U.S. Cl. .................. 365/189.09; 365/194
(58) Field of Classification Search ........... 365/189.09, 365/194
See application file for complete search history.

(56) References Cited

U.S. PATENT DOCUMENTS 6,327,202 B1 * 12/2001 Roohparvar ................ 365/203
6,724,679 B1 * 4/2004 Nagasawa et al. ...... 365/230.03
6,795,906 B1 * 9/2004 Matsuda ..................... 711/167
6,804,153 B1 * 10/2004 Yoshizawa et al. .... 365/189.07
6,873,555 B1 * 3/2005 Hiraki et al. ............... 365/194

* cited by examiner

*Primary Examiner*—M. Tran
(74) *Attorney, Agent, or Firm*—Martine Penilla & Gencarella, LLP

(57) ABSTRACT

In an environment wherein a microprocessor can operate at several different voltage levels depending upon the instantaneous throughput of the microprocessor, a memory and memory adjustment circuit that permits operating the memory at a plurality of voltages in response to the microprocessor is disclosed. The memory and memory adjustment circuit sense the instantaneous operating voltage of the microprocessor and adjust the operating voltage of the memory in response thereto. The memory adjustment circuit more particularly increases or decreases the memory's bit-line sense interval in response respectively to a decrease or increase in the memory's operating voltage.

9 Claims, 2 Drawing Sheets

DYNAMICALLY ADAPTABLE MEMORY

BACKGROUND OF THE INVENTION

1. Field of the Invention

The present disclosure relates generally to the design and manufacture of Integrated Circuits (ICs). More specifically, the present invention relates to power saving modifications to semiconductor memory devices.

2. Description of the Related Art

In all handheld computing and communications devices, including Personal Digital Assistants (PDAs), handheld computers and cellular telephones, careful management of power usage is critical to obtain the longest possible operating time from the battery before the battery must be either recharged or replaced. Each IC in the device must be designed to minimize its operating power requirements.

A general equation commonly used to quantify power consumption in an IC is:

$$Power = k\ C\ V^2\ f$$

where k is a constant that depends on the average level of IC activity, C is the IC's internal capacitance, V is the IC's operating voltage and f is the operating frequency of the IC.

Many known techniques are available to minimize power consumption in an IC. Process related techniques change the physical characteristics of the IC's transistors, thereby changing their power/performance behavior. Transistors with a lower threshold voltage switch faster, but have a greater leakage current. CMOS circuits built with these lower threshold voltages have a wider range of voltages where both the N-type and P-type transistors in the circuit are ON simultaneously, which generates a wasteful current flow known as the "crowbar current." These process techniques particularly affect the capacitance and operating voltage of the IC.

Architectural techniques, including varying the time and frequency of clock gating, address the average level of IC activity k and its operating frequency f. Circuit design techniques include reducing either the number or the size of the transistors needed to implement a given function, which reduces the capacitance of the IC. Finally, adjusting the basic electrical operating properties of the IC affects both the IC operating voltage and its operating frequency.

In most known portable devices, the microprocessors that run them and the memories that are coupled to the microprocessors to support microprocessor operation all run at a constant frequency. Although power saving methods have developed which include putting the microprocessor into a sleep mode when the device is idle, no useful processing typically occurs during these sleep modes. In order to process data, the microprocessor must be active and, in most known systems, if the microprocessor is active it operates at a single predetermined frequency.

It follows that memory coupled to and supporting the microprocessors has previously typically operated at only one speed. In the system's sleep mode, there are few or no memory accesses and the memory can be shut down completely. To allow memory to operate at different frequencies and different voltage levels, either the memory circuitry or its method of operation would have to be modifiable on demand.

Although power savings have been achieved using sleep modes, greater operational flexibility while still providing significant power saving is obviously desirable. Any decrement in memory performance occasioned by this power saving would also have to be minimized.

SUMMARY OF THE INVENTION

A first embodiment of the present invention operates in an environment where the handheld device's microprocessor has been designed to operate at several voltage levels, the voltage levels being adjusted dynamically during operation depending upon the microprocessor's workload. When less processing is required, the operating voltage is dropped, thereby saving power. Power savings may also be accomplished by either simultaneously lowering the microprocessor's operating frequency when lowering the operation voltage or simply lowering the microprocessor's operating frequency.

The power saving multiple operating mode microprocessor requires memories that can operate equally efficiently and successfully at different operating voltages, different operating frequencies or both. Although an embodiment of the present invention operates with a microprocessor, nothing herein should be taken to restrict the invention to operating only with a microprocessor. An embedded controller of any type might be used or any other similar device, provided the system in which it is used can operate at either multiple voltage levels, or at multiple operating frequencies, or both.

In current semiconductor memory design, it is possible to lower the operating voltage significantly without losing the contents of the semiconductor memory. Thus, adapting semiconductor memory to function at several different voltage levels is not constrained by the possible loss of the memory's contents.

A major problem occasioned by reducing the operating voltage of a semiconductor memory is the effect the voltage reduction has on the timing of the sense pulse used when reading the contents of the memory. In most known semiconductor memories, contents are indicated and sensed as a differential voltage on a bitline pair. A certain amount of time is required for the differential voltage to propagate down the bitline pair to a differential amplifier within the memory. The memory is designed with these propagation delays in mind. Although a certain propagation delay is accounted for in the memory design, this delay also varies from one supposedly identical memory to the next, in response to the various process variations inherent in the manufacture of ICs. For example, the transistors in one memory may have a higher threshold voltage and therefore operate more slowly than the transistors in another memory. If the memory is operated at a lower voltage than it was originally designed for, the proper differential voltage may not have sufficient time to be established on the bitline pair at the sense amplifier during the read pulse. In this case, a read failure would occur.

In a first embodiment, the present invention uses a variable timing adjustment circuit to adjust the internal clock timing of a given semiconductor memory. Typically, the adjustment circuit will slow the memory's self timing circuit during low voltage operation and speed up the memory's self timing circuit during high voltage operations. Adjusting the timing provides a longer interval to sense the memory's contents during low voltage operations.

By monitoring the operating level of ICs coupled to and accessing the memory, particularly the microprocessors that may be capable of operating at several different frequencies and operating voltage levels, the present invention can reduce power consumption significantly during periods of operation when memory accesses are few and still permit the memory to operate at high frequency levels when microprocessor activity is high.

Other aspects and advantages of the invention will become apparent from the following detailed description, taken in conjunction with the accompanying drawings, illustrated by way of example the principles of the invention.

DETAILED DESCRIPTION

Manufacturing and environmental variables insure that each completed microprocessor or memory performs slightly differently than all the other supposedly identical manufactured ICs. These slight variations result in the same microprocessor fabrication line creating supposedly identical microprocessors that run at speeds ranging from 250 MHz to 350 Mhz, for example. Post-production testing determines the proper operating frequency of each IC.

Figure 1:
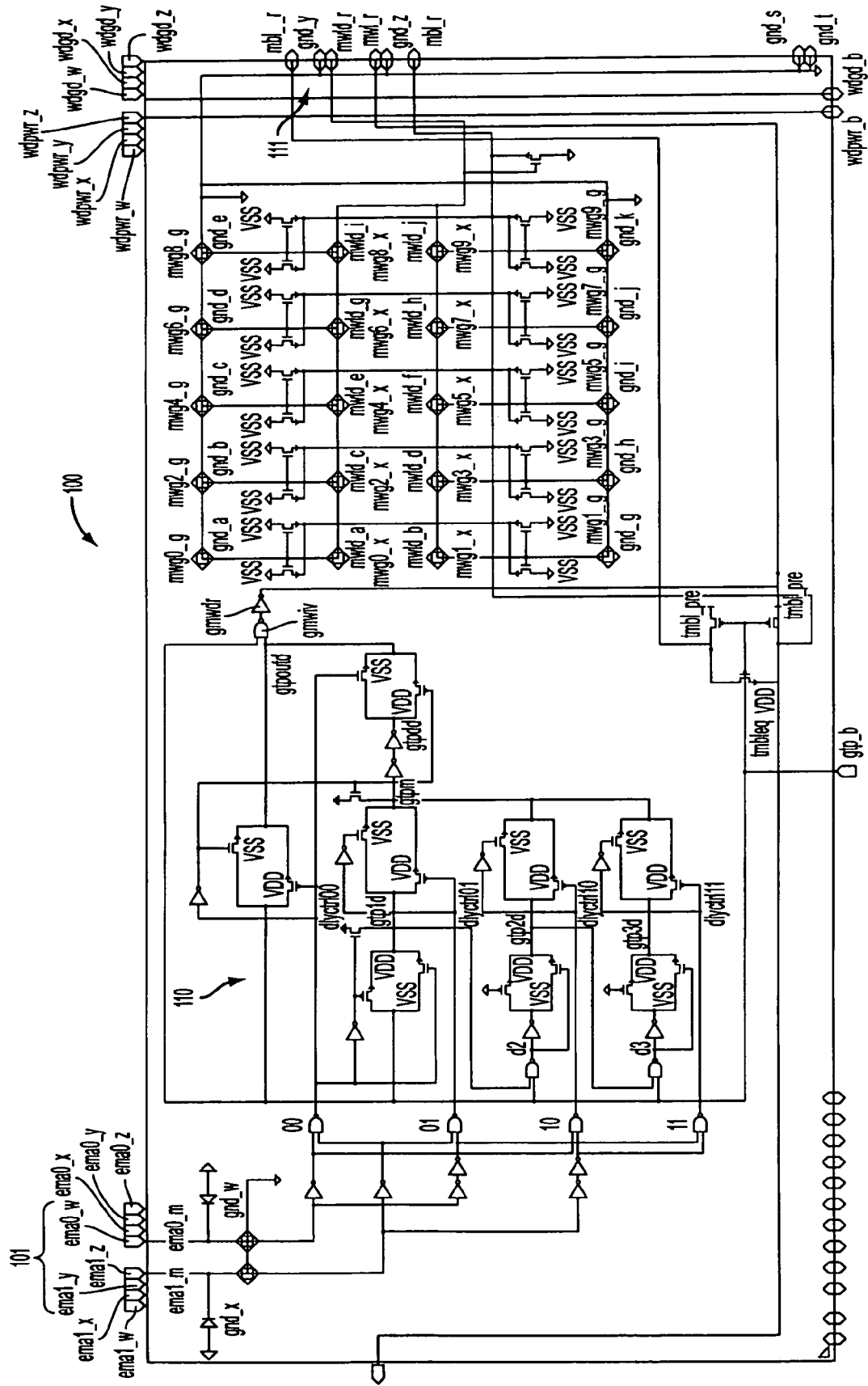
FIG. 1 is a circuit diagram of a particular embodiment of a timing delay circuit used in the present invention.

The same performance variations apply to all semiconductor memories, including RAM, read-only memory (ROM) and register files. To insure proper performance and correct signal timing, these variations must be addressed. Further effects that must also be compensated for include crosstalk, IR drop and glitches. To compensate for these variations and effects, semiconductor memories can be provided with an Extra Margin Adjustment (EMA) capability. As shown in FIG. 1, an EMA circuit 100 has a 2-bit input 101, a plurality of delay elements 110 and an output 111. In a particular embodiment, if the input values are "00", a default condition exists and the memory operates in a normal fashion. If the input values are "01," the memory's operation is delayed by 25%. Input values of "10" and "11" further increment the amount of delay that the memory operates at. At the maximum delay value, the memory can tolerate up to a 40% variation in the read current. In the context of this description, the delay comprises additional time for the memory to sense the differential voltage signal on the bitlines. Although the incremental delays noted in this embodiment vary linearly, in other embodiments non-linear variations in the delay values can be envisioned. For example, it could be desirable that each increment increases the delay time by an order of magnitude. Therefore, circuits which can generate a plurality of different delay signals or a signal with a plurality of different delay values should be considered to be within the scope of the present invention.

In operation, EMA circuit 100 would be used at startup by a Built-In Self-Repair (BISR) algorithm, which initially tests the memory with EMA circuit 100 set to its "00" default (normal) operational value. Using the BISR, the memory would be reconfigured and repaired as necessary. The same algorithm could then set the EMA circuit 100 to the "01" value, providing a 25% guard band to protect against any problems that might result from higher temperature operations after the system warms up.

It should be understood that EMA circuit 100 as illustrated in FIG. 1 is only one possible embodiment of such a circuit. Increasing the number of bits used for the input would allow for additional increments of delay, allowing the memory's timing to be more precisely regulated. With additional bits in the input value, the required delay circuitry would also increase, but in a manner within the skill of those with average ability in the particular field of semiconductor memory design. Typically delay elements 110 in EMA circuit 100 comprise a series of inverters. Other known delay elements such as resistor/capacitor networks or pass transistors could also be used.

Figure 2:
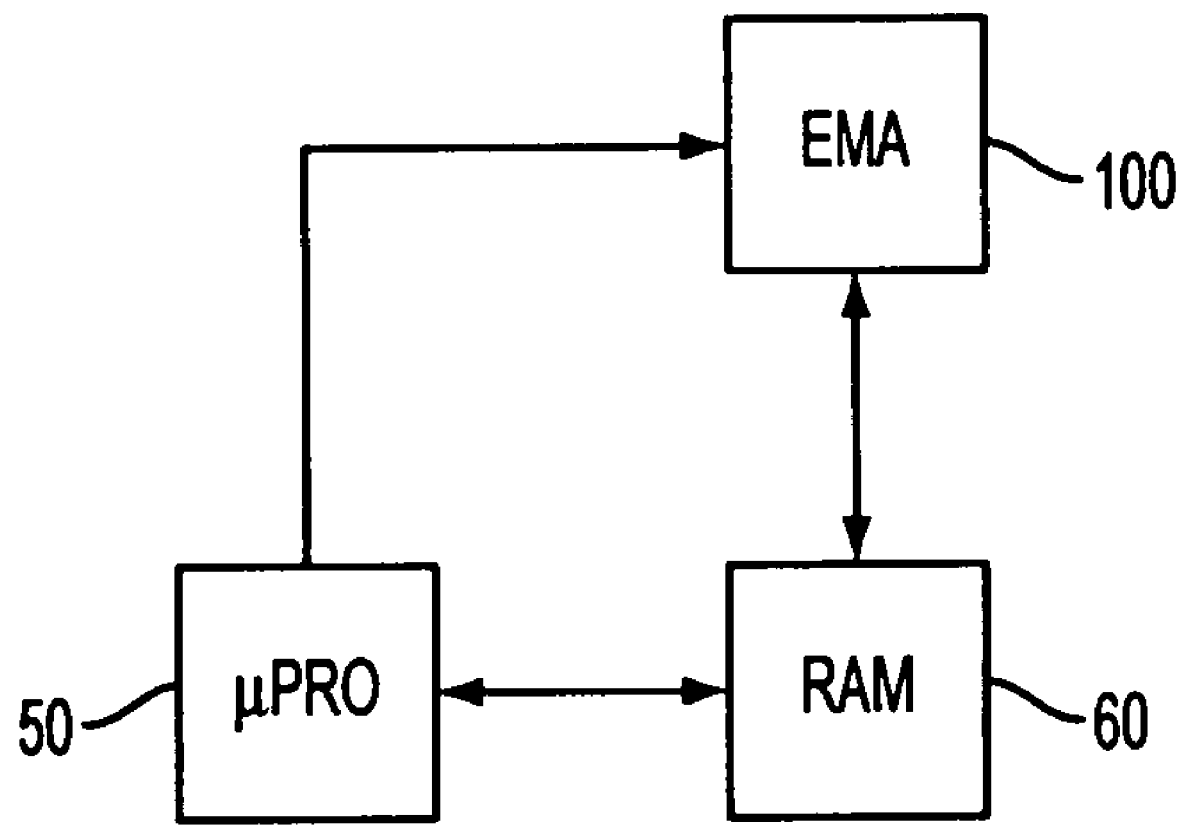
FIG. 2 is a block diagram of a computer system incorporating a first embodiment of the present invention.

In a computer system wherein the microprocessor has been designed to operate at several different voltage levels, the voltage level being dynamically reset depending upon overall system throughput demands, EMA circuit 100 is used to dynamically adjust the sensing timing of the memories coupled to the microprocessor. In this manner, the operating voltages of the memories can be lowered or raised in parallel with that of the microprocessor to adjust dynamically to varying workloads. An embodiment of the present invention using such a microprocessor is illustrated in FIG. 2. EMA circuit 100 can increase the amount of time allowed within the memories to sense the differential voltages on the memory's bitlines.

As shown in FIG. 2, microprocessor 50 is coupled to both EMA 100 and RAM 60. It should be understood that only part of the circuitry of a complete computing device is illustrated. In a computing environment, such a complete device would include some type of data display device, some type of user input device and additional types of semiconductor memory. In a microcontroller environment, the microcontroller would be coupled to the device or system being controlled and, in most such environments, at least one sensor would provide input to the microcontroller. For the purposes of this detailed specification, however, these particular environments and the particular devices related to those environments are either not relevant to the operation of the present invention (for example, the I/O devices and display devices in a computing environment) or would operate in a similar fashion to the illustrated components (for example, additional semiconductor memory, including Read Only Memory (ROM)). It should also be noted that although EMA 100 is illustrated as separate from RAM 60 in this embodiment, in other preferred embodiments EMA 100 would be fabricated on the same semiconductor chip as RAM 60. The physical location of EMA 100 is not of primary importance, as long as it can communicate in real time with microprocessor 50 and RAM 60.

During operation of this embodiment of the present invention, microprocessor 50 signals to EMA 100 that it is shifting to a reduced voltage operating mode. Receipt of this signal causes EMA circuit 100 to generate a delay appropriate to the amount of slowing of the microprocessor. The appropriate delay can be determined dynamically, by assessing microprocessor 50's operating speed and frequency, adjusting EMA 100 to provide a delay believed to be appropriate and then testing the memory to see if it operates properly with the selected delay. The process would continue iteratively until the memory passed the test. Alternatively, a fixed operating voltage X and/or a fixed operating frequency Y in microprocessor 50 would trigger a preset EMA 100 setting. Operation of the present invention in the microcontroller environment would be very similar, with the microcontroller signaling the EMA to increase the delay in response to a decreased operating frequency or decreased operating voltage or both in the microcontroller. The adjustments to the EMA in this environment could also be either preset or dynamically adjusted.

The delay generated by EMA 100 is then applied to RAM 60, where the extra time for data sensing, which is the end product of the generated delay, allows RAM 60 to operate at a reduced, power-saving voltage.

As microprocessor 50 changes its operating voltage level, EMA 100 will continue to adjust the delay it generates to insure that RAM 60 has adequate time to sense date during read operations.

Although the present invention has been described in one particular embodiment, that of a microprocessor and a RAM, it could also be incorporated in many other device configurations. Any type of circuit with multiple voltage levels of operation and/or multiple frequencies of operation could incorporate the present invention. These alternatives could include at least a Digital Signal Processor (DSP) or a network switch, as well as ROM. It is apparent that changes and modifications, at the very least along the lines suggested, may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. In a computing environment capable of operating at one of a plurality of voltage levels, the voltage level being adjusted dynamically in response to varying computational workloads, the computing environment further comprising at least a microprocessor, a memory system comprising:
    a memory capable of operating at a plurality of voltage levels and coupled to the microprocessor; and
    a timing adjustment circuit coupled to the memory and the microprocessor for dynamically adjusting the timing of the memory in response to changes in the operating voltage of the microprocessor.

2. A dynamically adjustable memory comprising:
    memory core comprising a plurality of memory cells, each cell capable of storing a bit of digital information, the memory core capable of storing the digital information at a plurality of voltage levels; and
    memory sense circuit coupled to the memory core for sensing the contents of a selected memory cell, the memory sense circuit capable of operating at a plurality of voltage levels; and
    timing adjustment circuit coupled to the memory core and the memory sense circuit for adjusting the timing of the memory sense circuit in response to changes in the operating voltage of the memory, the timing adjustment circuit coupling delay elements to the memory sense circuit, increasing the amount of time that the memory sense circuit has to detect the contents of the memory core during a read operation when the voltage level is decreased.

3. The dynamically adjustable memory of claim 2 wherein the timing adjustment circuit responds to changing voltage operating levels in a computing system to which the dynamically adjustable memory is coupled.

4. A method for enabling a semiconductor memory to function at a plurality of voltage levels, the method comprising the steps of:
    setting the operating voltage of the semiconductor memory dynamically during the operation of the semiconductor memory; and
    adjusting the sensing timing of a memory sensing circuit coupled to the semiconductor memory to increase the interval of time allowed to sense the contents of a storage bit in the semiconductor memory when the operating voltage of the semiconductor memory has been reduced.

5. The method of claim 4 wherein the step of increasing the interval of time further comprises coupling additional delay elements to the memory sensing circuit as the operating voltage of the semiconductor memory is reduced.

6. In a computing environment capable of operating at one of a plurality of voltage levels, the voltage level being adjusted dynamically in response to varying computational workloads, the computing environment further comprising at least a controller and at least a first sensor coupled to the controller, a memory system comprising:
    a memory capable of operating at a plurality of voltage levels and coupled to the controller; and
    a timing adjustment circuit coupled to the memory and the controller for dynamically adjusting the timing of the memory in response to changes in the operating voltage of the controller.

7. A computer, comprising:
    a processor capable of operating at several predefined voltage levels, the lowest predefined voltage level indicating the least amount of processor workload; and
    a dynamic memory subsystem coupled to the processor, the dynamic memory subsystem further comprised of at least:
    a plurality of bit cells to store digital information, the bit cells capable of storing digital information successfully at a plurality of predefined voltage levels; and
    a processor activity sensor system coupled to the processor and the bit cells, the processor activity sensor system sensing the activity level of the processor, reducing the voltage level of the bit cells in parallel with reductions in the processor's activity level and increasing the time allowed to sense the contents of the bit cells as the voltage level of the bit cells decreases.

8. The computer of claim 7 wherein delay elements are introduced into the dynamic memory subsystem to increase the amount of time allowed to sense the contents of the bit cells when the processor is operating at lower predefined voltage levels.

9. A method to reduce power consumption in a microprocessor system, the method comprising the operations of:
    monitoring the demand on the microprocessor;
    reducing the power consumption of the microprocessor by reducing one of its operating frequency and its operating voltage if the demand on the microprocessor falls below a first predefined operating level; and
    reducing the power consumption of memories coupled to the microprocessor by reducing the voltage level of bits cells in the memories and by increasing the amount of time allowed for sensing circuits to detect the contents of the memories while the power consumption of the microprocessor has been reduced.

* * * * *